United States Patent [19]
Abt et al.

[11] Patent Number: 5,236,550
[45] Date of Patent: Aug. 17, 1993

[54] METHOD FOR PLASMA ETCH OF RUTHENIUM

[75] Inventors: Norman E. Abt, Burlingame, Calif.; William H. Shepherd, Placitas, N. Mex.

[73] Assignee: National Semiconductor Corporation, Santa Clara, Calif.

[21] Appl. No.: 874,194

[22] Filed: Apr. 24, 1992

[51] Int. Cl.$^5$ .......................... B44C 1/22; C23F 1/00
[52] U.S. Cl. .................................... 156/643; 156/656; 156/659.1; 156/664; 437/245
[58] Field of Search ............ 156/643, 646, 656, 659.1, 156/664; 204/192.32, 192.35; 437/201, 245; 252/79.1

[56] References Cited

FOREIGN PATENT DOCUMENTS 0177509 7/1990 Japan .................................. 156/667

Primary Examiner—William A. Powell
Attorney, Agent, or Firm—Limbach & Limbach

[57] ABSTRACT

The present invention provides a process for patterning ruthenium. A layer of ruthenium is formed on a substrate. The ruthenium is masked. The ruthenium is exposed to an oxygen plasma.

2 Claims, No Drawings

METHOD FOR PLASMA ETCH OF RUTHENIUM

BACKGROUND

1. Field of the Invention

The present invention relates to etching processes, and more particularly, to a process for etching ruthenium using an oxygen plasma.

2. Discussion of the Prior Art

The use of plasma etching techniques to define features in the fabrication of printed circuits, including semiconductor integrated circuits, is generally known. Plasma etching is highly desirable because it etches anisotropically and therefore achieves high definition of fine lines and features. However, plasma etching has been used primarily to etch refractory metals, such as aluminum, tungsten, or titanium. See, for example, U.S. Pat. No. 3,923,569. Further, the only type of plasmas which have been effective to anistropically etch refractory metals are limited to some combination of chlorinated or fluorinated gas.

The use of ferroelectric materials to fabricate integrated circuit memory cells is also generally known. However, it is critical in such fabrications that the ferroelectric material be prevented from interacting with other features of the circuit, such as the refractory metals which are used to form interconnects or other conductive features. Ruthenium has been found to be an effective barrier to prevent interaction of refractory metal with ferroelectric material. However, the only effective known method of etching ruthenium involves sputter etching after patterning a hard mask, and this is a slow and expensive process step.

Thus, it would be desirable if ruthenium could be etched with high definition in a simple and quick processing step.

SUMMARY OF THE INVENTION

According to the present invention, there is provided a process for etching ruthenium, comprising exposing the ruthenium to an oxygen plasma. In the preferred embodiment, a layer of ruthenium is formed on a substrate, then masked, then exposed to an oxygen plasma.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

The present invention is illustrated through the results of Experiments A-E, which are summarized below. In general, the present invention is carried out by utilizing a conventional plasma reaction chamber. A silicon wafer having a sample of ruthenium thereon is placed in the chamber. The ruthenium is patterned by a photoresist or a hard mask such as titanium which had been previously patterned by conventional means. The chamber is evacuated, and oxygen is introduced at a low pressure (approximately 1 Torr). An electric field is applied across the chamber to produce a plasma. The exposed portions of the ruthenium are then etched away by the plasma. If the photoresist removal rate is close to the ruthenium removal rate, photoresist will also be removed, so that the hard mask must be used to maintain a distinct edge to the pattern. A titanium layer can be patterned with a photoresist mask and by a fluorine- or chlorine-containing plasma. The resist mask can be removed in the same step as the ruthenium.

A. Experiment A

A Branson/IPC 3000 barrel etcher was operated in the RF couple tunnel mode at a pressure of 1 Torr and a power that varied from 300–1000 W. After 5 minutes, a 500 Å layer of ruthenium was completely removed from the wafer.

B. Experiment B

A matrix single wafer etcher was operated in the RF tunnel mode at a pressure of 5 Torr and a power of 550 W. After 90 seconds, a 500 Å layer of ruthenium was completely removed from the wafer.

C. Experiment C

3. A GCA 606 single wafer etcher was operated in the RIE (reactive ion etching) mode at a pressure of 150 mTorr and a power of 600 W, and the temperature was clamped. After 1 minute, a 500 Å layer of ruthenium was completely removed from the wafer.

D. Experiment D

A Branson/IPC L3300 single wafer etcher was operated in the downstream mode, i.e., the chamber is separated and shielded from the wafers and the product gases from the chamber are flowed over the wafer, resulting in isotropic chemical etching. The chamber power was 600 W, and the downstream temperature was 250° C. After 5 minutes, the exposed ruthenium was not removed at all from the wafer.

E. Experiment E

A Tegal single wafer etcher was operated in the plasma mode. Pressure was varied between 1–5 Torr and power of 100 W was applied. After 2 minutes, the exposed ruthenium was not removed at all from the wafer.

F. Conclusions

It is believed that the volatile species is $RuO_4$, although it is not clear how this reaction is obtained. It is known that $RuO_2$ is stable and does not etch in the $O_2$ plasma. Therefore, it can be speculated that there are two possible mechanisms: ultraviolet (UV) or $O_3$ species. $O_3$ species are more prevalent in the large volume chamber, and fewer wall collisions result. The Tegal chamber has a high partial pressure of $N_2$ in the chamber which may destroy the $O_3$ species. Temperature is apparently not a factor.

It should be understood that the invention is not intended to be limited by the specifics of the above-described embodiment, but rather defined by the accompanying claims.

We claim:

1. A process for etching ruthenium, comprising exposing the ruthenium to an oxygen plasma.

2. A process for patterning ruthenium, comprising:
   a. forming a layer of ruthenium on a substrate;
   b. masking the ruthenium; and
   c. exposing the ruthenium to an oxygen plasma.

* * * * *